(12) United States Patent
Judd

(10) Patent No.: US 11,153,986 B2
(45) Date of Patent: *Oct. 19, 2021

(54) CONFIGURING A MODULAR STORAGE SYSTEM

(71) Applicant: International Business Machines Corporation, Armonk, NY (US)

(72) Inventor: Ian David Judd, Hursley (GB)

(73) Assignee: International Business Machines Corporation, Armonk, NY (US)

( * ) Notice: Subject to any disclaimer, the term of this patent is extended or adjusted under 35 U.S.C. 154(b) by 115 days.

This patent is subject to a terminal disclaimer.

(21) Appl. No.: 16/529,784

(22) Filed: Aug. 1, 2019

(65) Prior Publication Data
US 2019/0357374 A1  Nov. 21, 2019

Related U.S. Application Data

(63) Continuation of application No. 16/262,906, filed on Jan. 30, 2019, which is a continuation of application (Continued)

(30) Foreign Application Priority Data

Jul. 5, 2012 (GB) ...................................... 1211918

(51) Int. Cl.
*H05K 7/00* (2006.01)
*H05K 7/14* (2006.01)
(Continued)

(52) U.S. Cl.
CPC ................. *H05K 7/14* (2013.01); *G06F 1/00* (2013.01); *G06F 13/00* (2013.01); *G11B 33/127* (2013.01); *H05K 7/00* (2013.01); *Y10T 29/49826* (2015.01)

(58) Field of Classification Search
CPC ......... G11B 33/127; G06F 13/00; G06F 1/00; H05K 7/14; H05K 7/00; Y10T 29/49826
(Continued)

(56) References Cited

U.S. PATENT DOCUMENTS 5,379,184 A   1/1995   Barraza et al.
5,761,033 A   6/1998   Wilhelm
(Continued)

FOREIGN PATENT DOCUMENTS

GB   2378822    2/2003
JP   2008171386 7/2008
(Continued)

OTHER PUBLICATIONS

Notice of Allowance, dated Jan. 7, 2021, for U.S. Appl. No. 16/262,906, filed Jan. 30, 2019, Total 13 pages.
(Continued)

*Primary Examiner* — Anatoly Vortman
*Assistant Examiner* — Zhengfu J Feng
(74) *Attorney, Agent, or Firm* — Konrad Raynes Davda & Victor LLP; David W. Victor

(57) ABSTRACT

Provided is an enclosure for use in a modular storage system, the enclosure comprising a plurality of drive bays, a controller canister, an expansion canister, and a midplane connecting the drive bays to the canisters, wherein the controller canister occupies a greater volume of the enclosure than the expansion canister.

19 Claims, 7 Drawing Sheets

Related U.S. Application Data

No. 13/933,059, filed on Jul. 1, 2013, now Pat. No. 10,257,953.

(51) Int. Cl.
| | |
|---|---|
| *G06F 13/00* | (2006.01) |
| *G06F 1/00* | (2006.01) |
| *G11B 33/12* | (2006.01) |

(58) Field of Classification Search
USPC .................................................. 361/679.02
See application file for complete search history.

(56) References Cited

U.S. PATENT DOCUMENTS

| | | | |
|---|---|---|---|
| 7,069,358 | B2 | 6/2006 | Sakakibara et al. |
| 7,200,008 | B1 | 4/2007 | Bhugra |
| 7,304,855 | B1 | 12/2007 | Milligan et al. |
| 7,800,894 | B2 | 9/2010 | Davis |
| 8,756,440 | B2 | 6/2014 | Clemo et al. |
| 10,257,953 | B2 | 4/2019 | Judd |
| 2003/0033363 | A1 | 2/2003 | Garnett et al. |
| 2004/0103261 | A1* | 5/2004 | Honda .................. G06F 3/0605 |
| | | | 711/202 |
| 2006/0039108 | A1 | 2/2006 | Chikusa et al. |
| 2006/0048001 | A1* | 3/2006 | Honda .................. G11B 33/142 |
| | | | 714/6.32 |
| 2006/0101179 | A1* | 5/2006 | Lee ....................... G06F 13/364 |
| | | | 710/113 |
| 2006/0134936 | A1 | 6/2006 | Sullivan et al. |
| 2006/0221579 | A1 | 10/2006 | Liang et al. |
| 2006/0265449 | A1* | 11/2006 | Uemura .................. G06F 1/189 |
| | | | 709/203 |
| 2008/0037218 | A1 | 2/2008 | Sharma et al. |
| 2008/0055875 | A1* | 3/2008 | Berke .................. H05K 7/1487 |
| | | | 361/800 |
| 2008/0130219 | A1 | 6/2008 | Rabinovitz |
| 2008/0191590 | A1 | 8/2008 | Lin et al. |
| 2008/0257639 | A1* | 10/2008 | Yamaguchi ........ H05K 7/20736 |
| | | | 181/198 |
| 2009/0135558 | A1 | 5/2009 | Hughes |
| 2010/0082874 | A1* | 4/2010 | Baba ..................... G06F 3/0227 |
| | | | 710/316 |
| 2010/0172087 | A1 | 7/2010 | Jeffery et al. |
| 2011/0072290 | A1* | 3/2011 | Davis ....................... G06F 1/30 |
| | | | 713/324 |
| 2011/0083992 | A1 | 4/2011 | Stuhlsatz et al. |
| 2011/0261526 | A1 | 10/2011 | Atkins et al. |
| 2015/0092788 | A1 | 4/2015 | Kennedy et al. |
| 2019/0166711 | A1 | 5/2019 | Judd |

FOREIGN PATENT DOCUMENTS

| | | |
|---|---|---|
| WO | 2010097132 | 9/2010 |
| WO | 2013162586 | 10/2013 |

OTHER PUBLICATIONS

List of IBM Patents or Patent Applications Treated as Related, dated Aug. 1, 2019, 2 pages.
Final Office Action, dated Nov. 27, 2019, for U.S. Appl. No. 16/262,906, filed Jan. 30, 2019, Total 26 pages.
Response to Final Office Action2, dated Nov. 24, 2020, for U.S. Appl. No. 16/262,906, filed Jan. 30, 2019, Total 8 pages.
Pre Appeal Brief, dated Nov. 23, 2020, for U.S. Appl. No. 16/262,906, filed Jan. 30, 2019, Total 6 pages.
Respone to Final Office Action, dated Feb. 2, 2020, for U.S. Appl. No. 16/262,906, filed Jan. 30, 2019, Total 8 pages.
Office Action3, dated Mar. 18, 2020, for U.S. Appl. No. 16/262,906, filed Jan. 30, 2019, Total 27 pages.
Response to Office Action, dated Jun. 18, 2020, for U.S. Appl. No. 16/262,906, filed Jan. 30, 2019, Total 12 pages.
Final Office Action2, dated Sep. 28, 2020, for U.S. Appl. No. 16/262,906, filed Jan. 30, 2019, Total 24 pages.
Machine Translation for JP2008171386, published Jul. 28, 2004, pp. 1-29.
"Storage Bridge Bay Specification", dated Sep. 21, 2006, Storage Bridge Bay Working Group, Version 1.0, pp. 1-87.
S. Bohac et al., "Enterprise Disk Storage Subsystem Directions", dated Jun. 2009, White Paper, pp. 1-10.
International Search Report, dated Nov. 1, 2012, for Application No. GB1211918.6, filed Jul. 5, 2012, pp. 1-4.
Office Action, dated Mar. 10, 2016, for U.S. Appl. No. 13/933,059, filed Jul. 1, 2013, Total 10 pages.
Response to Office Action, dated Jun. 10, 2016, for U.S. Appl. No. 13/933,059, filed Jul. 1, 2013, Total 10 pages.
Final Office Action, dated Sep. 28, 2016, for U.S. Appl. No. 13/933,059, filed Jul. 1, 2013, Total 18 pages.
Response to Final Office Action, dated Dec. 26, 2016, for U.S. Appl. No. 13/933,059, filed Jul. 1, 2013, Total 11 pages.
Office Action, dated Apr. 25, 2017, for U.S. Appl. No. 13/933,059, filed Jul. 1, 2013, Total 20 pages.
Response to Office Action, dated Jul. 23, 2017, for U.S. Appl. No. 13/933,059, filed Jul. 1, 2013, Total 11 pages.
Final Office Action, dated Oct. 4, 2017, for U.S. Appl. No. 13/933,059, filed Jul. 1, 2013, Total 19 pages.
Pre-Appeal Brief Request for Review, dated Jan. 4, 2018, or U.S. Appl. No. 13/933,059, filed Jul. 1, 2013, Total 9 pages.
Office Action, dated Jun. 11, 2018, for U.S. Appl. No. 13/933,059, filed Jul. 1, 2013, Total 19 pages.
Response to Office Action, dated Sep. 11, 2018, for U.S. Appl. No. 13/933,059, filed Jul. 1, 2013, Total 8 pages.
Notice of Allowance, dated Nov. 19, 2018, for U.S. Appl. No. 13/933,059, filed Jul. 1, 2013, Total 9 pages.
Preliminary Amendment for U.S. Appl. No. 16/262,906, dated Jan. 30, 2019, 8 pp.
Office Action 1 for U.S. Appl. No. 16/262,906, dated Apr. 8, 2019, 25 pp.
Response to Office Action 1 for U.S. Appl. No. 16/262,906, dated Jul. 8, 2019, 11 pp.

* cited by examiner

CONFIGURING A MODULAR STORAGE SYSTEM

CROSS-REFERENCE TO RELATED FOREIGN APPLICATION

This application is a non-provisional application that claims priority benefits under Title 35, United States Code, Section 119(a)-(d) from United Kingdom Patent Application entitled "AN ENCLOSURE" by Ian D. JUDD, having United Kingdom Patent Application Serial No. GB1211918.6, filed on Jul. 5, 2012, which United Kingdom Patent Application is incorporated herein by reference in its entirety.

BACKGROUND OF THE INVENTION

1. Field of the Invention

The present invention relates to a modular storage system and a method for configuring the modular storage system using two such enclosures.

2. Description of the Related Art

Modular disk storage systems which use rack-mounted enclosures are widely used in computing. These enclosures are often based on the Storage Bridge Bay (SBB) technology standard. SBB defines a standard electronics "canister", in terms of its dimensions, mid-plane signals and connectors, power supplies and cooling. For example, the IBM® Storwize® V7000 uses enclosures of size 2U that conform to the current SBB 2.0 standard. Each enclosure provides a number of hot-swap drive bays at the front and two slots for electronics canisters at the rear. The dual canisters provide redundancy to ensure High Availability (HA). The first enclosure is a control enclosure that contains two controller canisters which run complex software to provide functions like remote copy, caching, thin provisioning and RAID. Up to nine expansion enclosures can be attached to support additional drives. An expansion enclosure is configured with two expansion canisters. (IBM and Storwize are registered trademarks of International Business Machines Corp. in the United States and other countries).

The controller canister is tightly packaged and contains a central processing unit (CPU) complex, host interfaces, a Serial Attached SCSI (SAS) protocol chip and a SAS expander chip. However, an expansion canister just contains a single SAS expander chip plus a small amount of memory. SBB is a very efficient package for mid-range storage systems. However it constrains the CPU, memory and I/O resources which can be provided in a high-end controller. One option is to lengthen the SBB canister while keeping the other two dimensions unchanged. This has the advantage of compatibility with existing enclosures but it only provides a modest increase in card area and it offers no relief on power and cooling. The SBB working group is developing a 3.0 standard which may increase the canister height. However packaging two such canisters will probably require an enclosure of 3U size. Current storage systems have two controller canisters in the first enclosure and two expansion canisters per expansion enclosure. All canisters are the same size, as defined by the SBB standard.

SUMMARY

Provided is an enclosure for use in a modular storage system, the enclosure comprising a plurality of drive bays, a controller canister, an expansion canister, and a midplane connecting the drive bays to the canisters, wherein the controller canister occupies a greater volume of the enclosure than the expansion canister.

Further provided is a modular storage system comprising: a plurality of drive bays; a first enclosure including a first controller canister coupled to the drive bays and a first expansion canister, wherein the first controller canister occupies a greater volume of the enclosure than the first expansion canister; and a second enclosure including a second controller canister and a second expansion canister, wherein the second controller canister occupies a greater volume of the enclosure than the second expansion canister.

Further provided is a method of configuring a modular storage system comprising: inserting two enclosures into the modular storage system, each enclosure comprising a plurality of drive bays, a controller canister, an expansion canister, and a midplane connecting the drive bays to the canisters, wherein the controller canister occupies a greater volume of the enclosure than the expansion canister.

BRIEF DESCRIPTION OF THE DRAWINGS

Preferred embodiments of the present invention will now be described, by way of example only, with reference to the following drawings, in which.

DETAILED DESCRIPTION

According to one embodiment, there is provided an enclosure for use in a modular storage system, the enclosure comprising a plurality of drive bays, a controller canister, an expansion canister, and a midplane connecting the drive bays to the canisters, wherein the controller canister occupies a greater volume of the enclosure than the expansion canister.

According to a further embodiment, there is provided a method of configuring a modular storage system comprising inserting two enclosures into the modular storage system, each enclosure comprising a plurality of drive bays, a controller canister, an expansion canister, and a midplane connecting the drive bays to the canisters, wherein the controller canister occupies a greater volume of the enclosure than the expansion canister.

With the described embodiments, it is possible to provide an enclosure that can be used to package one controller canister and one expansion canister in each of the first two enclosures used in a modular storage system and the space in the enclosure is divided asymmetrically, so that the controller canister has more space than the expansion canister. This significantly relieves the packaging constraints for high-end controllers. The controller canister occupies a greater volume of the enclosure than the expansion canister and this means that more space is available for the contents of the controller canister. Rather than having two controller canisters in one enclosure, two enclosures can be used with one controller canister in each of the first two enclosures. The asymmetric use of space, with respect to the canisters, allows the functionality of the controller canister to be increased.

Figure 1:
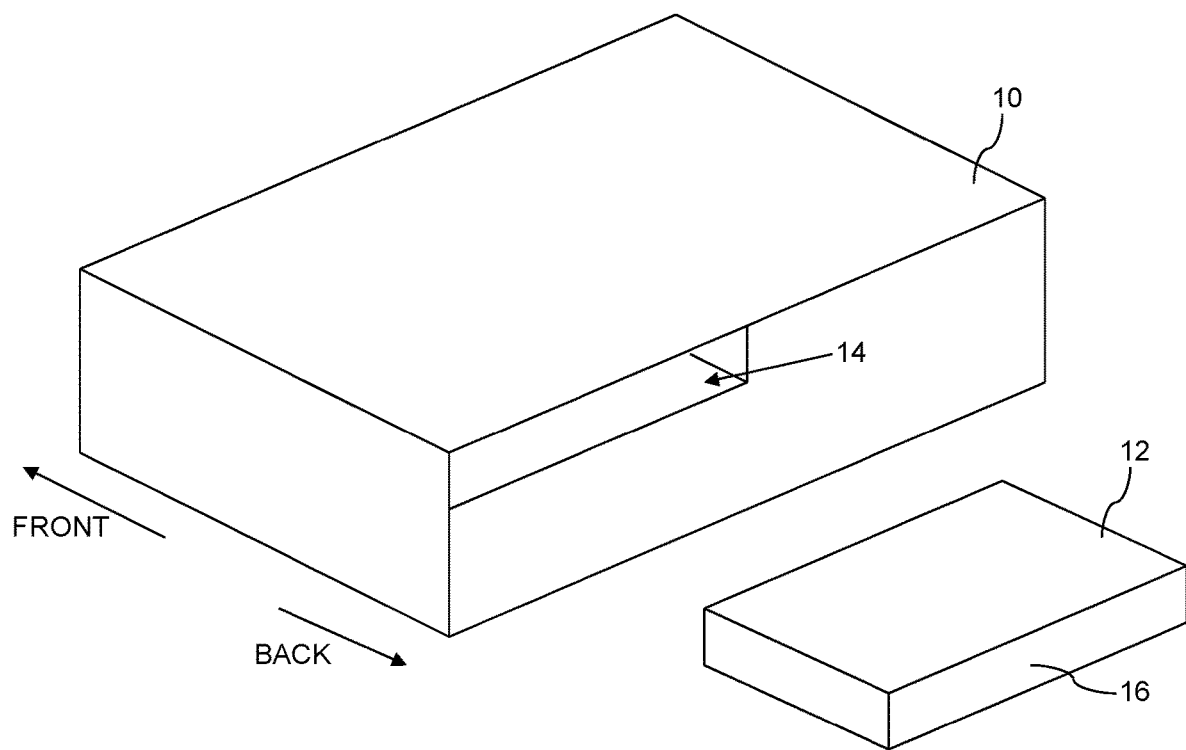
FIG. 1 is a schematic diagram of an enclosure and a canister.

FIG. 1 is a schematic diagram (not necessarily to scale) of an enclosure 10. This enclosure 10 is shown in perspective from above and behind. The arrows and attached labels indicate the front and back of the enclosure 10. Also illustrated is a canister 12, which is designed to fit into a slot 14 at the rear of the enclosure 10. The backplate 16 of the canister 12 is also labeled, this will be exposed when the canister 12 is fitted into the slot 14 of the enclosure 10. The enclosure 10 of FIG. 1 is according to the SBB specification and the canister 12 can be considered to be an SBB canister 12 that will fit into an SBB slot 14.

FIG. 1 is designed to show the terminology conventions used when discussing the enclosures 10 and the canisters 12. This FIG. 1 illustrates the broad principle of an enclosure 10 that has a canister 12 fitted therein. The position and number of the canisters 12 within the enclosure 10 is variable, depending upon the desired functions and capabilities of the enclosure 10. The enclosure 10 can be used in modular storage systems, which are cabinets that have spaces for receiving enclosures 10, normally in a vertical stacking. Such cabinets also provide power and electrical connections and often have their own computing functions in order to manage the enclosures 10 contained within the cabinet.

The enclosures 10 have a vertical height that is often expressed using the unit "U", so a specific cabinet may be constructed to receive enclosures of various heights in multiples of 1U. The standardization of the cabinets, enclosures and canisters allows different hardware manufacturers to provide compatible components that mean that an end user can mix and match the enclosures as they desire. The enclosures 10 are commonly used to provide enterprise storage solutions for large businesses for example. A single cabinet will include multiple enclosures 10 which contain disk drives in addition to the canisters 12. The disk drives provide storage solutions for the large amount of data that is now very common in businesses.

Figure 2:
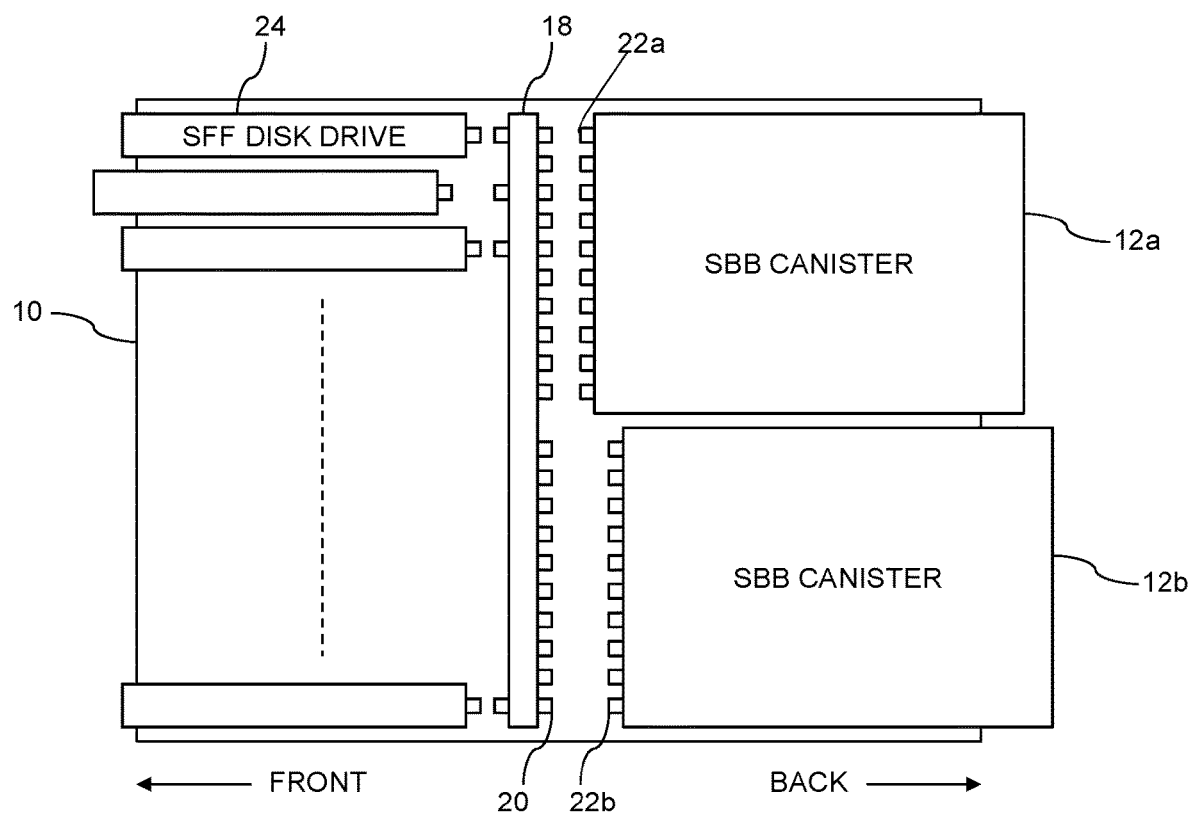
FIG. 2 is a schematic diagram of the interior of an enclosure with two canisters.

A second embodiment of an enclosure 10 is shown in FIG. 2. This Figure shows the interior of the enclosure 10, which is able to receive two SBB canisters 12a, 12b side-by-side. Again, the arrows and attached labels indicate the front and back of the enclosure 10. Also shown in this FIG. 2 is a midplane 18, which is a physical element to which the canisters 12a, 12b are connected. The midplane 18 has interconnects 20 which mate with corresponding interconnects 22a, 22b found on the front of the canisters 12a, 12b. The midplane 18 divides the enclosure into front and back portions. The front of the enclosure 10 houses the drive bays which support disk drives 24. The disk drives are usually arranged in one of two different ways in a 2U enclosure, depending on the drive form factor. 2.5" small-form-factor (SFF) drives are arranged in one row of twenty-four drives standing on edge. FIG. 2 shows this configuration. 3.5" large form-factor (LFF) drives are arranged in three rows of four drives lying flat.

The canisters 12a, 12b if they conform to the SBB standard, have their external dimensions defined by the standard and also have the structure and function of their interconnects 22a, 22b defined by the standard. An enclosure 10 that wishes to receive SBB canisters must provide slots 14 (FIG. 1) of the necessary size and must provide a midplane 18 (FIG. 2) that conforms to the physical and functional requirements of the standard. A canister 12, 12a, 12b is any functional entity that can be inserted into a slot 14. The canister 12, 12a, 12b is a replaceable unit that comprises an external case with interconnects 22a, 22b and internal electronics. The two canisters 12a, 12b of FIG. 2 are normally identical.

The layout of the enclosure 10 is configured according to the manufacturer's desire, but essentially the drive bays are at the front 24 of the enclosure 10, the midplane 18 separates the drive bays from the back of the enclosure 10 and the canisters 12a, 12b are at the back of the enclosure 10 and are connected to the midplane 18. The canisters 12a, 12b provide functionality that is either specific to the enclosure 10 that contains the canisters 12a, 12b or one or more of the canisters 12a, 12b provide functionality that is related to all of the enclosures 10 within a cabinet. As discussed above, a typical cabinet will have multiple enclosures 10 vertically stacked inside the cabinet.

Figure 3:
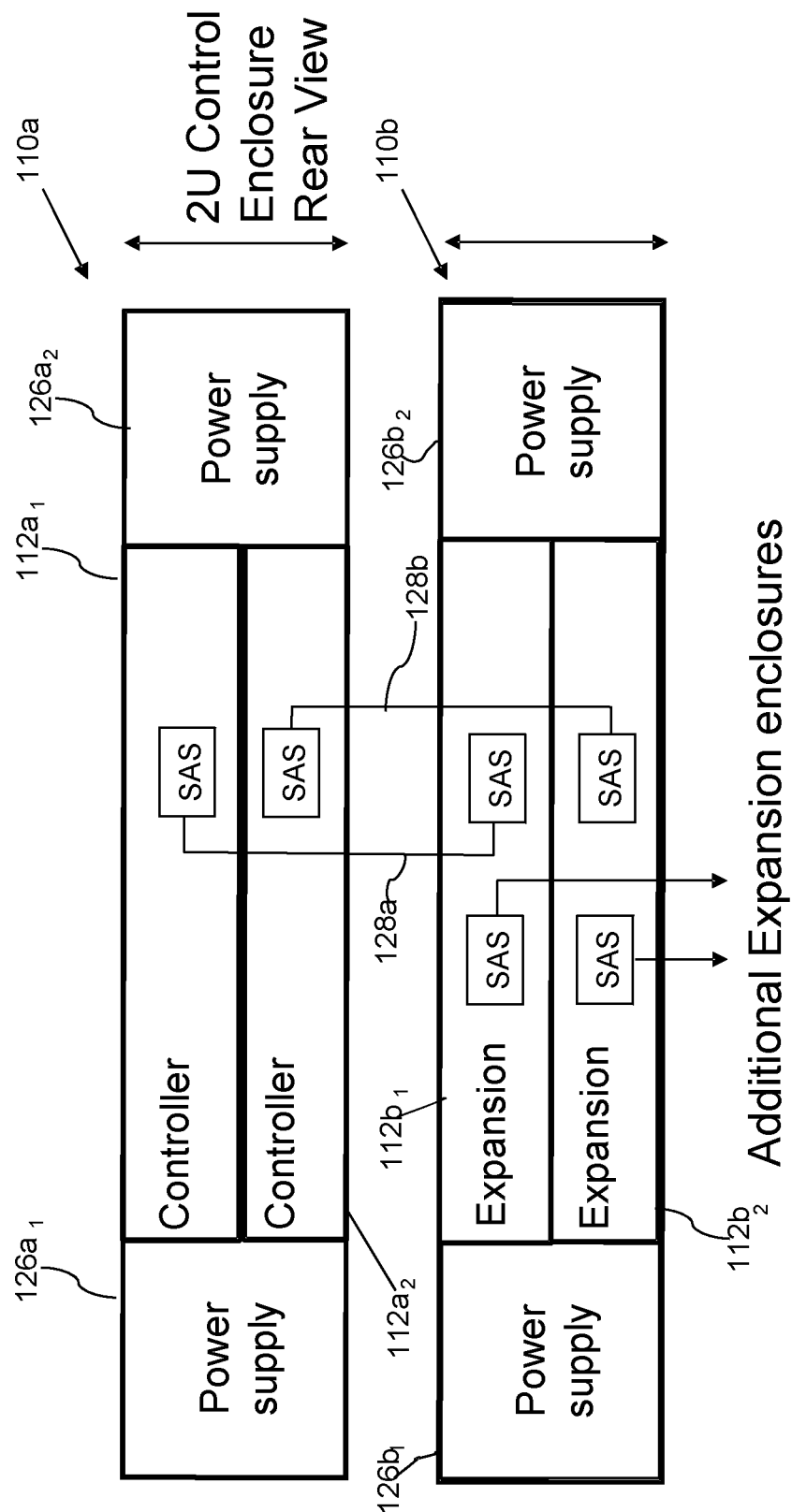
FIG. 3 is a schematic diagram of the rear of two enclosures as known in the prior art.

FIG. 3 shows two enclosures 110a, 110b that can be used in a modular storage system such as a cabinet as described above. In a vertical stack of enclosures 110a, 110b, the two enclosures 110a, 110b shown in FIG. 3 may be the topmost two enclosures 110a, 110b in the cabinet. These enclosures 110a, 110 are configured such that the rear canisters $112a_1$, $112a_2$, $112b_1$, $112b_2$ are arranged vertically one above the other (rather than horizontally side-by-side as shown in FIG. 2, for example). Each enclosure 110a, 110b is also provided with two power supplies $126a_1$, $126a_2$, $126b_1$, $126b_2$ and cables 128a, 128b connect together canisters $112a_1$ and $112b_1$ and $112a_2$ and $112b_2$ in different enclosures 110a, 110b. The two enclosures 110a, 110b are the same size, having a vertical height of 2U and the various canisters $112a_1$, $112a_2$, $112b_1$, $112b_2$ are all the same size.

The enclosures 110a, 110b conform to the current SBB 2.0 standard and are of size 2U. Each enclosure 110a, 110b provides hot-swap drive bays at the front and has two slots for the SBB canisters $112a_1$, $112a_2$, $112b_1$, $112b_2$ at the rear. The dual canisters $112a_1$, $112a_2$, $112b_1$, $112b_2$ provide redundancy to ensure so-called high availability. The upper enclosure 110a is a control enclosure that contains two controller canisters $112a_1$, $12a_1$ which run complex software to provide functions such as remote copy, caching, thin provisioning and RAID. The lower, expansion enclosure 110b can be attached to support additional drives, as can subsequent additional expansion enclosures 110b. Each expansion enclosure 110b is configured with two expansion canisters $112b_1$, $112b_2$.

The construction of the enclosures 110a, 110b and the nature of the SBB standard create a constraint on the high-end controller packing of the controller canister $112a_1$, $112a_2$. Equally, the expansion canisters $112b_1$, $112b_2$ have far more space than is needed for actual electronic components that are carried in an expansion canister $112b_1$, $112b_2$. The upper control enclosure 110a is provided with two controller canisters $112a_1$, $112a_2$ in order to provide redundancy in relation to the functions provided by the canisters $112a_1$, $112a_2$. For much the same reason that there are two power supplies $126a_1$, $126a_2$, $126b_1$, $126b_2$ in each enclosure 110a, 110b, the two controller canisters $112a_1$, $112a_2$ are able to duplicate their function so that should one of the canisters fail, then the other will still be available.

Figure 4:
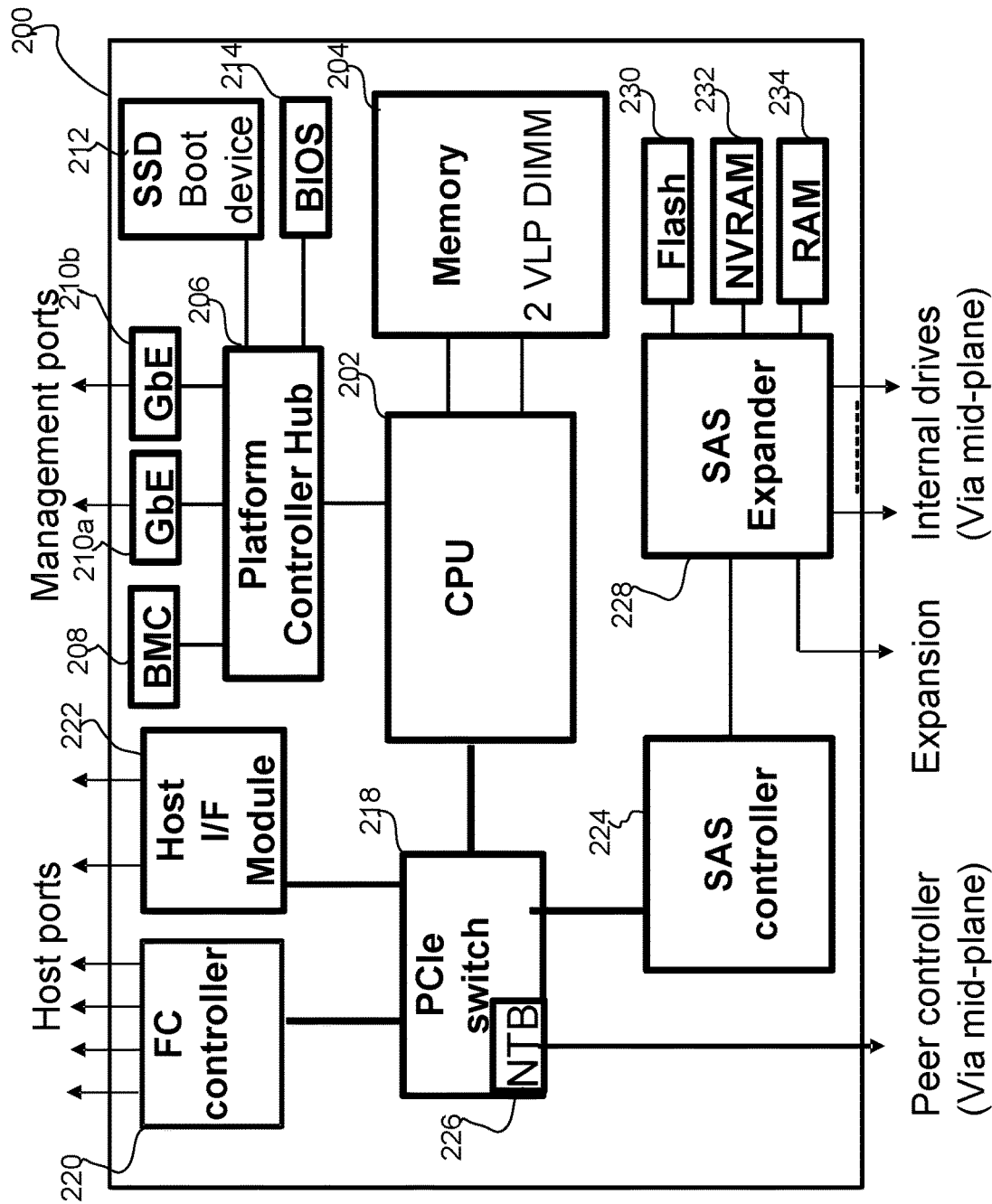
FIG. 4 is a schematic diagram of components of a controller canister.

FIG. 4 shows the internal components of a controller canister 200, such as canisters $112a_1$, $112a_2$. The CPU complex runs the controller code. It contains a CPU 202, memory 204, Platform Controller Hub 206, Baseboard Management Controller (BMC) 208, Ethernet management ports (GbE) 210a, 210b, a Solid State Disk (SSD) 212 for the boot device and a BIOS 214. The memory 204 is packaged on two Very Low Profile (VLP) Dual Inline Memory Modules (DIMMs). The CPU 202 also provides a number of PCI Express lanes for I/O. These are connected via a PCI Express switch 218 to a Fibre Channel (FC) chip 220 for the host interface, an optional Host Interface Module (HIM) 222 for additional host ports and a SAS controller chip 224. The PCI Express 218 switch also contains a Non-Transparent Bridge (NTB) 226 for the link which connects to the peer controller via the midplane. The SAS controller 224 attaches to a SAS expander 228 which connects to the internal drive slots via the midplane and an external connector for expansion enclosures. The SAS expander 228 also contains an embedded CPU core to manage the enclosure and drives.

By contrast, an expansion canister $112b_1$, $112b_2$ will only have a subset of the components shown in FIG. 4. An expansion canister $112b_1$, $112b_2$ will only need to have the SAS expander 228 and its associated memory chips, the Flash 230, NVRAM 232 and RAM memory 234 components. The SAS expander 228 connects to the internal drive slots via the midplane and two external connectors. The upstream connector is cabled to the previous control or expansion enclosure in a chain. The downstream connector is cabled to the next expansion enclosure. The SAS expander 228 also contains an embedded CPU core to manage the enclosure and drives.

Figure 5:
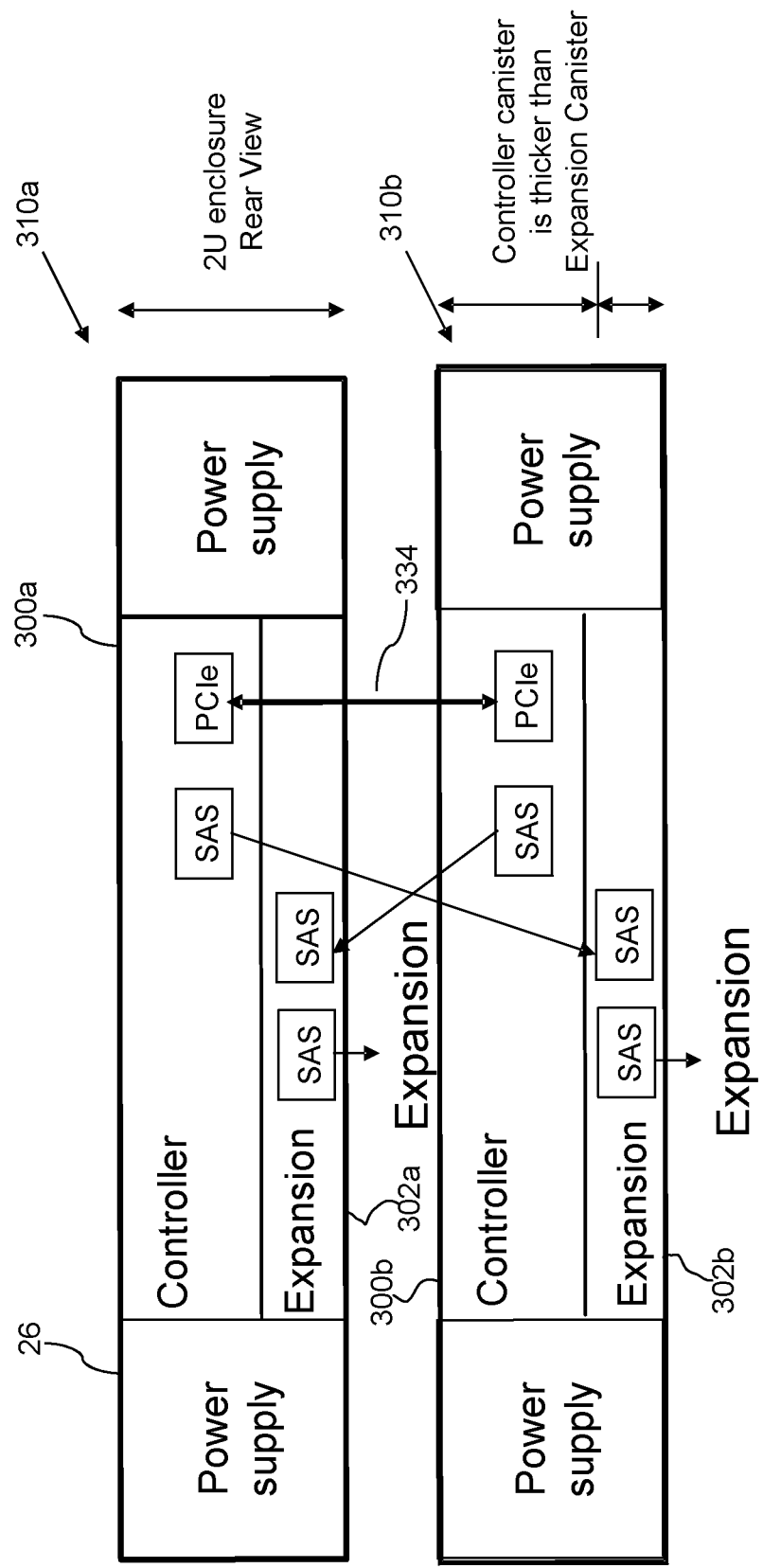
FIG. 5 is a schematic diagram of an embodiment of the rear of two enclosures.

FIG. 5 shows an improved design of the enclosure and canisters. The enclosures 310a, 310b of FIG. 5 are still a standard 2U vertical size with a plurality of drive bays at the front of the enclosures 310a, 310b and a midplane 18 separating the drive bays from the back of the enclosure 310a, 310b, with a controller canister 300a, 300b at the back of the enclosure 310a, 310b and connected to the midplane 18, and an expansion canister 302a, 302b at the back of the enclosure 310a, 310b and connected to the midplane 18 but the controller canister 300a, 300b occupies a greater volume of the enclosure 310a, 310b than the expansion canister 302a, 302b.

Essentially, the two canisters 300a, 302a and 300b, 302b used in the enclosures 310a, 310b, respectively, are of an asymmetric size. In the configuration of FIG. 5, the controller canisters 300a, 300b have a greater vertical height than the expansion canisters 302a, 302b, all other measurements being equal. The vertical height within the enclosure 310a, 310b is not split 50/50 between the two canisters 300a, 300b and 302a, 302b as in the prior art design of FIG. 3. The controller canister 300a, 300b is larger than the expansion canister 302a, 302b. This increases the volume available to the contents of the controller canister 300a, 300b and this means that either additional components can be used in the controller canister 300a, 300b or cheaper versions of the components can be used.

The solution of FIG. 5 puts one controller canister 300a, 300b in each of first two enclosures 310a, 310b used in a cabinet. This allows each controller canister 300a, 200b to use a larger share of enclosure 310a, 310b resources and provides more space for host interface modules, CPU heatsink and battery backup. There is no need for very low profile (VLP) DIMMs when using stacked canisters. More power and cooling can be provided to the components of the controller canister 300a, 300b. The inter-controller links in the midplane 18 are replaced with an additional PCIe cable 334. The reduction in size of the expansion canister 302a, 302b has no impact on its cost or function.

Figure 6:
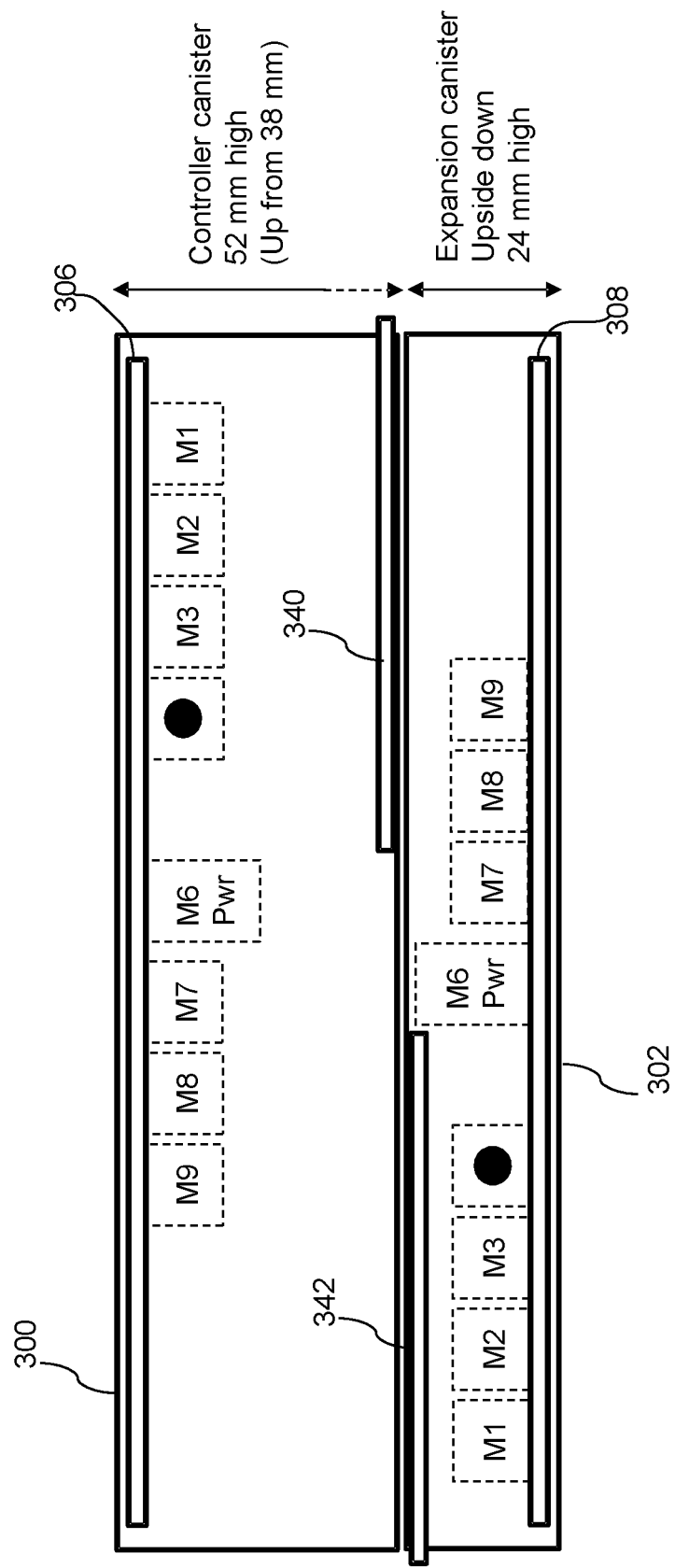
FIG. 6 is a schematic diagram of an embodiment of the rear of two canisters showing the SBB midplane connectors.

FIG. 6 shows a rear view 300 of two canisters 300 and 302, such as canisters 300a, 300b and 302a, 302b, in an improved enclosure 310, such as 310a, 310b. The SBB midplane connectors M1 to M9 are viewed from the rear of enclosure. The lower canister 302 is upside down in this product, which places the midplane connectors of the two canisters 300 and 302 further apart. A printed circuit board 306 is shown for the controller canister 300 and a printed circuit board 308 is shown for the expansion canister 302. Respective latches 340 and 342 are also shown for the controller canister 300 and the expansion canister 302.

The different sizes of the canisters 300 and 302 result in an asymmetric controller canister 300 that is 14 mm higher than the current prior art controller canister 12a. Correspondingly, the expansion canister 302 is 14 mm shorter in its vertical height. The controller canister 300 occupies a greater volume of the enclosure than the expansion canister 302. The resulting larger controller canister 300 is therefore able to accommodate standard 30 mm low-profile DIMM's with 3 mm to spare and supports the use of two HIMs on the same riser using low-profile PCIe cards. A single HIM has a restricted component height, ~10 mm versus 14.47 mm in PCIe standard. There is a requirement to reposition the enclosure spigot for the controller latch 340.

The table below provides a comparison of the prior art symmetric design of canisters with the improved asymmetric design of canisters.

|  | Prior art (symmetric) | Improved (asymmetric) |
| --- | --- | --- |
| Max controller power | 2 × 175 Watts | 300 Watts (+50 W expansion) |
| Max CPU power | 65 Watts | 95+ Watts |
| Max memory with 4 G bit chips | 32 GB (4 VLP DIMMs) | 64 GB (4 LP DIMMs) |
| Rear panel area for connectors | 77 square cm. | 106 square cm (1.38×) |
| Host interface modules (PCIe low-profile cards) | 1 | 2 on same riser (1 restricted to 10 mm component height) |
| Battery | Difficult to package within the canister | Easier to package internally |
| Minimum HA configuration | 1 enclosure | 2 enclosures |

Figure 7:
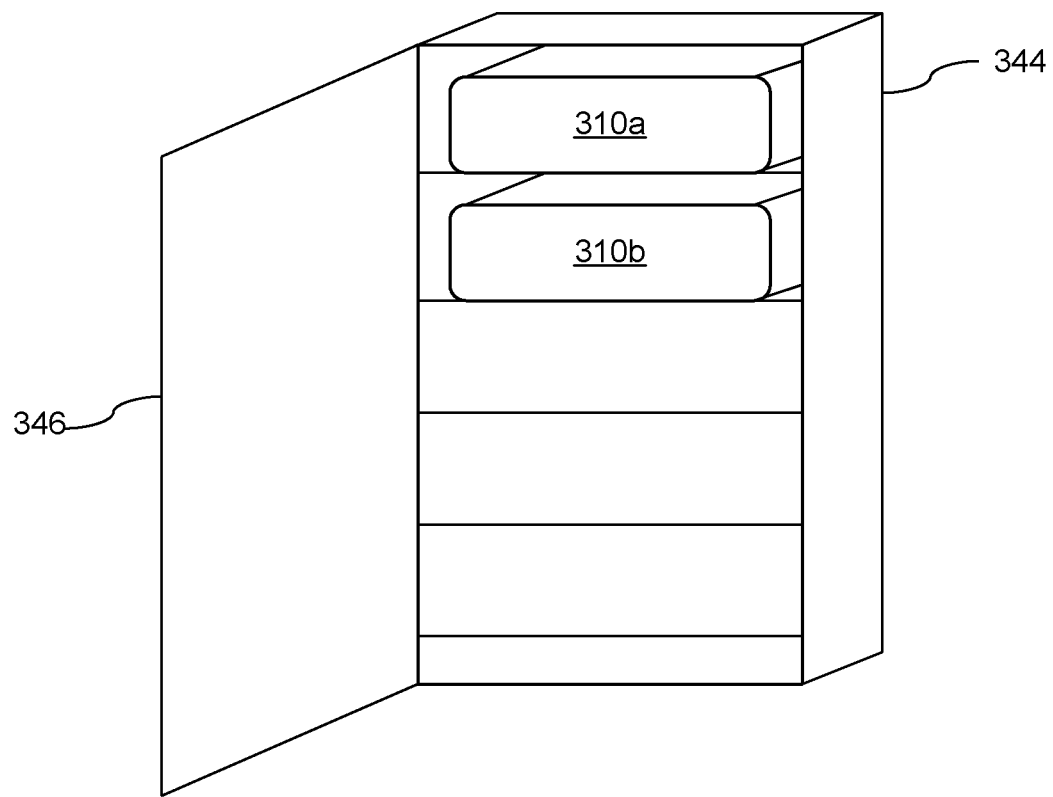
FIG. 7 is a schematic diagram of an embodiment of a cabinet with two enclosures therein.

As can be seen from the above, the use of the asymmetric design has numerous advantageous features when compared with the prior art symmetric design, all of which stem from the increased size of the controller canister 300. If a high availability configuration is being used (final row of the table), then two enclosures 310a, 310b will be needed in the cabinet to provide two individual controller canisters 300a, 300b. FIG. 7 illustrates a modular storage system (not to scale) being a cabinet 344 with its door 346 open which includes two enclosures 310a, 310b, where each enclosure 310a, 310b is utilizing the asymmetric canisters 300 and 302 described above.

The table above shows the advantages of the asymmetric arrangement of canisters over current SBB designs. The table assumes a layout such as the IBM Storwize V7000 with the two canisters stacked one above the other, as shown in FIG. 6. Some enclosures have an alternative layout with the canisters side-by-side across the full width of the enclosure, as shown in FIG. 2, and the power supplies are underneath. In this case, the improved design increases the controller card area but not the canister height. Most of the advantages still apply except that it would not be possible to use standard low-profile DIMMs.

What is claimed is:

1. An enclosure for use in a modular storage system to communicate with a host, the enclosure comprising:
a plurality of drive bays for disk drives,
a controller canister including first processing components comprising a processor, memory for use by the processor, first hardware to communicate with the disk drives when positioned in the drive bays, a host interface to communicate with the host, and a plurality of lanes to connect to a bus interface switch to connect with the host interface;
an expansion canister including second processing components and second hardware to communicate with the disk drives when positioned in the drive bays, wherein the second processing components comprise instances of a subset of fewer of the first processing components in the controller canister, wherein the controller canister occupies a greater volume than the expansion canister, and wherein the expansion canister does not include any additional host interface to communicate with the host;
a midplane connecting the drive bays to the controller and the expansion canisters, wherein the controller and the expansion canisters are connected to the midplane; and
at least one power supply supplying power to the controller canister and the expansion canister.

2. The enclosure of claim 1, wherein the at least one power supply comprises two power supplies each connected to the controller canister and the expansion canister.

3. The enclosure of claim 1, wherein the expansion canister has an expander with a first connector to connect to another controller canister and a second connector to connect to another expansion canister.

4. The enclosure of claim 1, wherein the controller canister has a greater vertical height than the expansion canister.

5. The enclosure of claim 1, wherein the controller canister and the expansion canister are side-by-side.

6. The enclosure of claim 1, wherein the controller canister and the expansion canister are stacked in a vertical orientation with the controller canister stacked above the expansion canister.

7. The enclosure of claim 1, wherein the controller canister and the expansion canister each have an upper end and a lower end with respect to a vertical orientation in which the controller canister and the expansion canister are stacked, wherein a printed circuit board of the controller canister is positioned at the upper end of the controller canister and a printed circuit board of the expansion canister is positioned at a lower end of the expansion canister.

8. A modular storage system in communication with a host, comprising:
a plurality of drive bays for disk drives;
a first enclosure including:
a first controller canister including first controller canister processing components comprising a first processor, a first memory for use by the first processor, and first controller canister hardware to communicate with the disk drives when positioned in the drive bays and coupled to the drive bays, a first host interface to communicate with the host, and a plurality of lanes to connect to a bus interface to connect with the host interface;
a first expansion canister including first expansion canister processing components, and first expansion canister hardware required to communicate with the disk drives when positioned in the drive bays, wherein the first expansion canister processing components comprise instances of a subset of fewer of the first controller canister processing components in the first controller canister, wherein the first controller canister occupies a greater volume of the first enclosure than the first expansion canister, and wherein the first expansion canister does not include any additional host interface to communicate with the host; and
at least one first power supply supplying power to the first controller canister and the first expansion canister; and
a second enclosure including:
a second controller canister including second controller canister processing components comprising a second processor, a second memory for use by the second processor, and second controller canister hardware to communicate with the disk drives when positioned in the drive bays;
a second expansion canister including second expansion canister processing components and second expansion canister hardware required to communicate with the disk drives when positioned in the drive bays, wherein the second expansion canister processing components comprise instances of a subset of fewer of instances of the second controller canister processing components in the second controller canister, wherein the second controller canister occupies a greater volume of the second enclosure than the second expansion canister; and
at least one second power supply supplying power to the second controller canister and the second expansion canister.

9. The modular storage system of claim 8, wherein the first and second controller canisters in the first and second enclosures, respectively, are connected by an external cable.

10. The modular storage system of claim 8, wherein the first and second controller canisters have a greater vertical height than the first and second expansion canisters, respectively.

11. The modular storage system of claim 8, wherein the at least one first power supply and the at least one second power supply comprise:
two power supplies in each of the first and the second enclosures, wherein the first controller canister and the first expansion canister share the two power supplies in the first enclosure and wherein the second controller canister and the second expansion canister share the two power supplies in the second enclosure.

12. The modular storage system of claim 8, wherein in the first enclosure, the first controller canister and the first expansion canister are stacked in a vertical orientation with the first controller canister stacked above the first expansion canister and wherein in the second enclosure, the second controller canister and the second expansion canister are stacked in the vertical orientation with the second controller canister stacked above the second expansion canister.

13. The modular storage system of claim 12, further comprising:
a cabinet including a door having a first shelf in which the first enclosure is disposed and a second shelf in which the second enclosure is disposed.

14. A method for configuring a modular storage system comprising:
inserting two enclosures into the modular storage system having controller canisters and expansion canisters, wherein each of the two enclosures comprises a plurality of drive bays, one of the controller canisters, one of the expansion canisters, and a midplane connecting the drive bays to the controller and the expansion canisters, wherein each of the controller canisters includes controller canister processing components comprising a processor, memory for use by the processor, controller canister hardware to communicate with disk drives when positioned in the drive bays, a host interface to communicate with a host, and a plurality of lanes to connect to a bus interface switch to connect with the host interface, wherein each of the expansion canisters includes expansion canister processing components and expansion canister hardware required to communicate with the disk drives when positioned in the drive bays, wherein the expansion canister processing components comprise instances of a subset of fewer of the controller canister processing components in the controller canister, wherein each of the expansion canisters does not include any additional host interface to communicate with the host, wherein each of the controller canisters occupies a greater volume than one of the expansion canisters in a same enclosure of the two enclosures, and wherein each of the two enclosures include at least one power supply to supply power to the controller and the expansion canisters.

15. The method of claim 14, wherein the at least one power supply in each of the two enclosures further comprises two power supplies each connected to one of the controller canisters and one of the expansion canisters.

16. The method of claim 14, wherein each of the expansion canisters has an expander with a first connector to connect to another controller canister and a second connector to connect to another expansion canister.

17. The method of claim 14, wherein each of the controller canisters of each of the two enclosures has a greater vertical height than one of the expansion canisters in a same enclosure of the two enclosures.

18. The method of claim 14, wherein one of the controller canisters and one of the expansion canisters of each of the enclosures are side-by-side.

19. The method of claim 14, further comprising connecting the controller canisters, one in each of the two enclosures by an external cable.

* * * * *